United States Patent [19]

Stavis

[11] Patent Number: 4,606,463
[45] Date of Patent: Aug. 19, 1986

[54] INTEGRATED CIRCUIT DEVICE CARRIER

[75] Inventor: Leonard A. Stavis, Easton, Mass.

[73] Assignee: American Paper Box Company, Inc., Charlestown, Mass.

[21] Appl. No.: 495,796

[22] Filed: May 18, 1983

[51] Int. Cl.⁴ .............................................. A47F 7/00
[52] U.S. Cl. ..................................... 211/13; 206/334; 248/309.1; 248/346
[58] Field of Search ............... 206/328, 329, 330, 334, 206/565; 361/400; 211/13, 59.1, 74; 174/52 FP; 248/309.1, 309.2, 309.3, 309.4, 346; 29/741, 759; 47/41 R, 41.13

[56] References Cited

U.S. PATENT DOCUMENTS

| 410,175 | 9/1889 | McAlister | 211/59.1 X |
| 1,966,247 | 7/1934 | Janssen | 248/309.2 |
| 2,332,352 | 10/1943 | Smith | 47/41.13 |
| 3,048,942 | 8/1962 | Boetticher et al. | 47/41.13 |
| 3,108,401 | 10/1963 | Richardson | 47/41 X |
| 3,906,666 | 9/1975 | Daenen et al. | 47/41.13 |
| 4,241,829 | 12/1980 | Hardy | 206/334 X |

Primary Examiner—Robert W. Gibson, Jr.
Attorney, Agent, or Firm—Lahive & Cockfield

[57] ABSTRACT

An IC device carrier having a base and a number of spaced apart, upright, flexible plastic fibers of uniform length having support tips for supporting the underside of the IC device while the pins of the device extend downwardly between the fibers.

7 Claims, 4 Drawing Figures

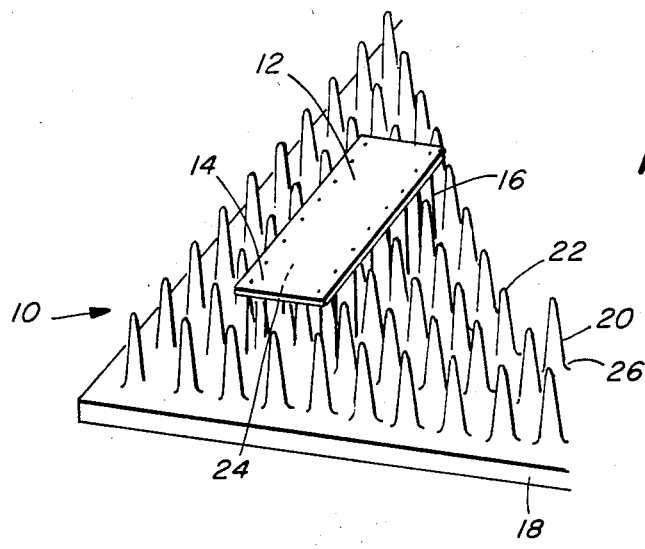
FIG. 1
FIG. 4
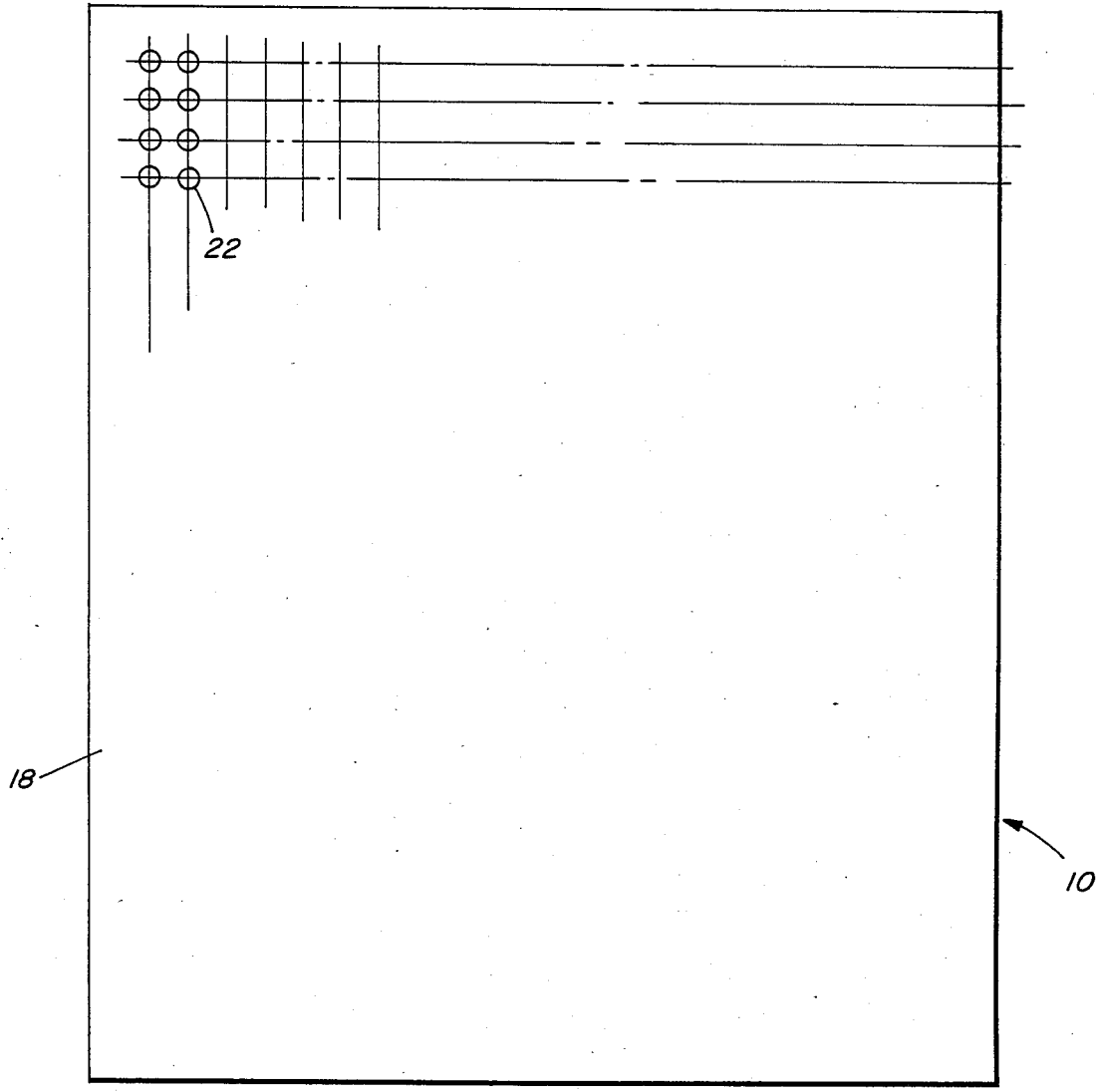

INTEGRATED CIRCUIT DEVICE CARRIER

BACKGROUND

This invention relates generally to carriers for IC devices, and particularly to carriers for IC devices or components with pins extending downwardly from the undersides of the devices.

IC, or integrated circuit, devices are electronic devices that typically take the configuration of small rectangular blocks (e.g., one-half inch wide by one inch long) from which a number of pins project downwardly. The block contains the integrated circuit. The downwardly projecting pins, usually arranged in parallel rows, provide electrical access and mechanical support for the device.

During assembly of the IC devices, a base with the pins attached is joined to an upper portion containing the integrated circuit. The pins are long, low in structural strength, and easy to bend. Great care has to be taken in transporting the devices, e.g. during such assembly operations, to avoid bending or otherwise damaging the pins.

One approach is to transport the devices in carriers designed for the purpose. Such carriers support the devices in ways that keep the pins relatively safe from damage. One such carrier, for example, has a body with open ended slots deeper than the height of the pins. The width of the slots is selected so that the edges of the IC device ride on the edges of the slots. A succession of devices may be inserted in a slot and slid along to be removed.

Such a carrier has limitations. The width of the slots must be carefully chosen and may be appropriate only for some devices and not others. Care must be shown in inserting IC devices into the slots so that pins are not bent. Random loading or unloading of devices on the carrier is difficult. There are opportunities for improvements in carriers for IC devices (or components, such as the bases, of such devices).

It is an object of the invention to provide carriers for IC devices that are inexpensive and convenient to use, that allow quick and easy random loading and unloading of devices on the carrier, and that minimize damage or bending of pins of the devices.

SUMMARY OF THE INVENTION

The invention is a carrier for supporting IC devices that have pins extending downwardly from the underside of the device, in which the carrier includes a base and a plurality of elongate, upright, support members fixed to the base and extending upwardly from the base. The support members terminate at their upward ends in support tips for supporting the IC devices by supportably engaging the undersides of the devices.

In preferred embodiments, the support tips lie in a plane, and are flexible, plastic fibers of uniform length, regularly spaced apart, defining distances between adjacent support members that are less than the width of the IC devices.

BRIEF DESCRIPTION OF THE DRAWING

Other objects, features and advantages of the invention will be set out, or will be inherent in, the following description of preferred embodiments of the invention, including the drawing thereof, in which:

FIG. 1 is a perspective view of a portion of a carrier embodying the invention;

FIG. 4 is a plan view of another embodiment of the invention.

DESCRIPTION OF PREFERRED EMBODIMENTS

Figure 2:
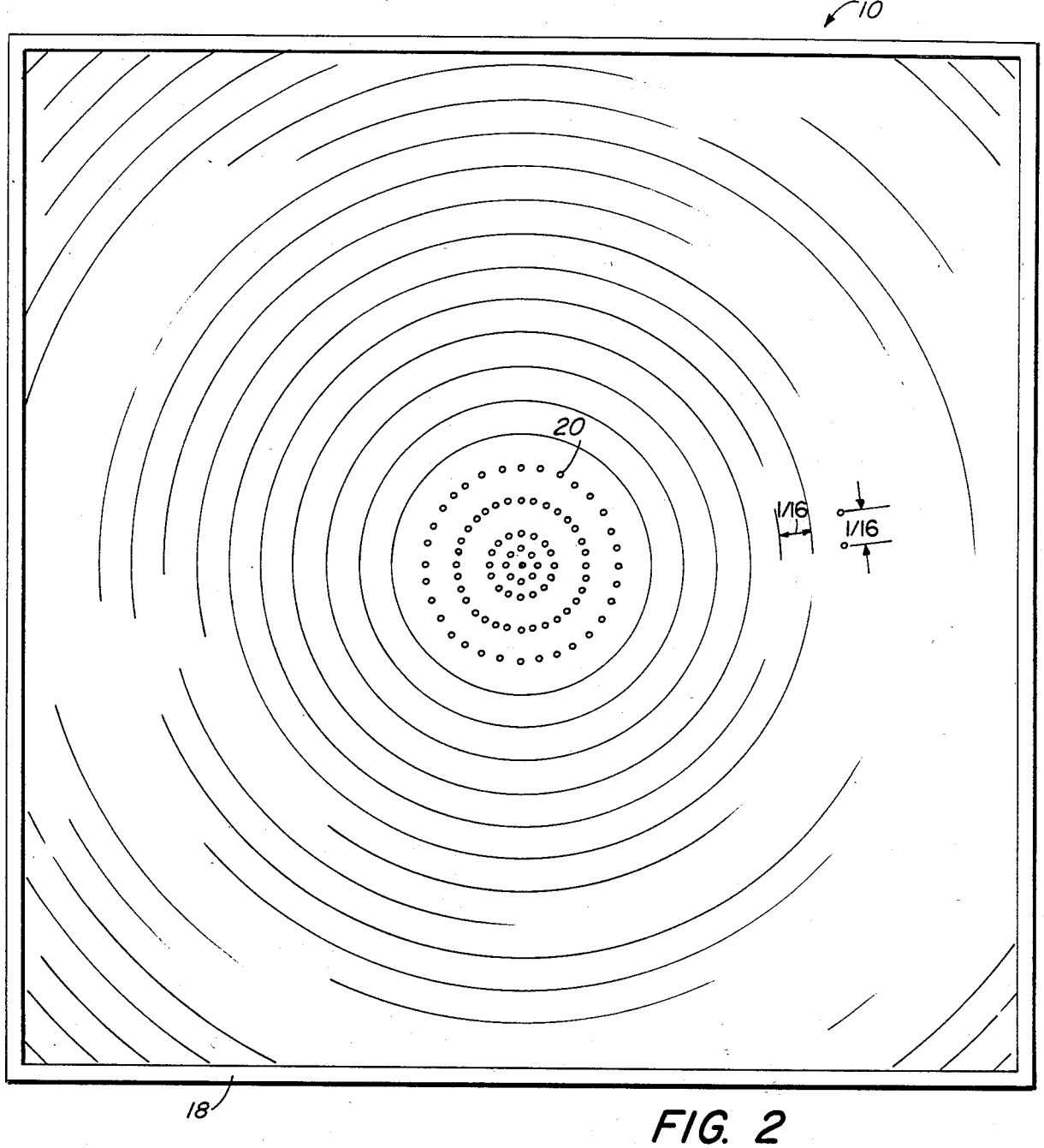
FIG. 2 is a plan view of the carrier of FIG. 1.
Figure 3:
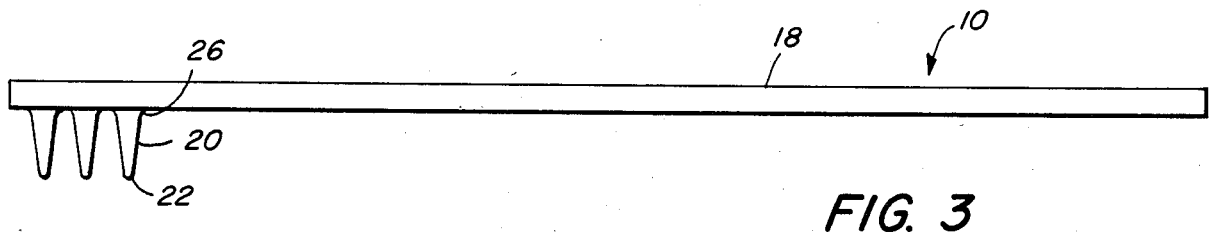
FIG. 3 is an elevation view of the carrier of FIG. 1.

FIGS. 1-3 show one embodiment of an IC device carrier 10. FIG. 1 shows a portion of the carrier 10 with an IC device 12 supported by the carrier 10. The IC device 12 shown in FIG. 1 is actually a portion, the lower portion, of a complete IC unit. That is, the device 12 is a lower assembly portion 14 including two rows of pins 16 already installed in the lower portion 14, ready for the next step, the installation of an upper portion (not shown) containing the integrated circuit. After the assembly of the upper portion to the lower portion 14, a complete IC unit, suitable for insertion in a circuit board, etc., will result. The purpose of the carrier 10 shown in FIGS. 1-3 is to support the device 12, which is the lower portion, during steps preliminary to the assembly of the upper portion. Of course the carrier 10 would be equally useful for supporting an IC device that is a completely assembled unit, such as in the assembly operations of a manufacturer who assembles IC components in its products.

The carrier 10 is injection molded from a mixture of low and high density polyethylene. It has a square base 18 approximately 8 inches on a side, that is 3/32 inch thick. Fixed to the base 18, and extending upwardly from the base, are a large number of upright fibers 20.

The fibers 20 provide elongate, upright support members for supporting the IC device 12. The fibers 20 are flexible, but capable of standing upright to support IC devices 12. The base 18 is substantially planar, and the fibers 20 are a uniform length. As a result, the upper tips 22 of the fibers 20, which engage the underside 24 of the IC device 12 to support it, lie in a plane.

The fibers 20 are regularly arranged on the base 18. In the embodiment shown in FIGS. 1-3, the fibers 20 are arranged in a pattern of circles about the center of the base 18. Each circle has a radius 1/16 inch larger than the next smaller circle, and along the circumference of each circle, each fiber 20 is spaced from the next fiber 20 on the circumference by approximately 1/16 inch.

The IC device 12 can therefore be presented to the carrier 10 at any location, and oriented in any direction, as long as it is parallel to the plane of the fiber tips 22. The fibers 20, and therefore the fiber tips 22 are spaced apart so that the distance between the tips 22 (center-to-center) is less than the width of the IC device 12. Then support for the device will be found whatever its orientation on the carrier. The fibers 20 may be spaced very closely together, but this is not ordinarily necessary. Also, of course, if the fibers 20 are packed too closely, it may be difficult to insert the pins 16 downwardly between the fibers.

In the embodiment shown in FIGS. 1-3, the fibers 20 are 0.88 inch high, and taper from a wider bottom 26, fixed to the base 18, to a narrower tip 22, which is rounded. The length of the fibers 20 is selected to exceed the pin length of the IC device 12 to be supported.

Also, in that embodiment, the arrangement of fibers 20 in concentric circular patterns eliminates straight paths and rows of fibers 20. IC devices 12 placed on the carrier 10 are less likely to shift position as a result, because any movement will cause the typically aligned pins 16 to come into interference with the non-aligned fibers 20.

If such shifting of position is desirable, or if a pattern of aligned fibers 20 is desirable for other reasons, the fibers 20 may be so arranged. FIG. 4 shows a pattern of linearly arranged fibers 20 in rows and columns. This is, in many cases, a suitable alternative embodiment of the invention.

As FIG. 1 shows, the IC device 12 is carried on the carrier 10 by inserting the pins 16 downwardly into the spaces between the fibers 20 and having the underside 24 of the device 12 supported on the support tips 22 of the fibers 20. The flexibility of the fibers 20 and the distance of the fibers 20 from each other allow the pins 16 to be inserted without damage to them or bending. Because IC devices 12 are ordinarily light in weight, even fairly thin and flexible plastic fibers 20 will be adequate to support them. The devices 12 are ultimately lightly supported by a carrier 10 that presents a random access, flexible, "soft" support structure.

The particular arrangement, form and size of the base or the fibers may be modified from those shown in the illustrative embodiments in ways suggested above or in ways that will occur to those skilled in the art. Such modifications would nevertheless be within the spirit and scope of the invention as claimed in the following claims:

What is claimed is:

1. A carrier for supporting integrated circuit devices that have pins extending downwardly from the underside of the device, comprising:
   base means, and
   a plurality of elongate, upright, flexible support members fixed to said base means and extending upwardly from said base means, said support members having lengths exceeding the length of said pins,
   said elongate, upright, flexible support members terminating at their upward ends in support tips for supporting and cushioning said devices by supportably engaging the undersides of said devices,
   wherein said elongate, upright, flexible support members are spaced apart, defining distances between adjacent support members that are less than the width of said devices said support members being adapted to provide lateral support to said pins.

2. The carrier of claim 1 wherein said support tips lie in a plane.

3. The carrier of claim 1 wherein said elongate, upright, support members comprise plastic fibers.

4. The carrier of claim 3 wherein said elongate fibers are regularly spaced apart and are of a uniform length.

5. The carrier of claim 1 wherein said fibers are closely spaced relative to the pin-to-pin separation of said device.

6. A carrier for supporting integrated circuit devices that have pins extending downwardly from the underside of the device comprising:
   a planar base means, and
   a plurality of flexible plastic fibers, of uniform length, fixed to said base means and extending upwardly from said base means, said fibers having lengths exceeding the length of said pins, and ending in support tips for supporting and cushioning said devices by supportably engaging the undersides of said devices,
   wherein said flexible plastic fibers are regularly spaced apart by distances less than the width said devices, said support members being adapted to provide lateral support to said pins.

7. The carrier of claim 6 wherein said fibers are closely spaced relative to the pin-to-pin separation of said device.

* * * * *